United States Patent
Wang et al.

(10) Patent No.: US 6,902,980 B2
(45) Date of Patent: Jun. 7, 2005

(54) METHOD OF FABRICATING A HIGH PERFORMANCE MOSFET DEVICE FEATURING FORMATION OF AN ELEVATED SOURCE/DRAIN REGION

(75) Inventors: Yin-Pin Wang, Kaohsiung (TW); Chih-Sheng Chang, Hsin-Chu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 46 days.

(21) Appl. No.: 10/455,038

(22) Filed: Jun. 5, 2003

(65) Prior Publication Data

US 2004/0248369 A1 Dec. 9, 2004

(51) Int. Cl.[7] .............................................. H01L 21/336
(52) U.S. Cl. .................... 438/305; 438/151; 438/197; 438/300; 438/527; 438/595; 438/607; 438/704; 438/757; 438/761
(58) Field of Search ................................. 438/143, 151, 438/197, 299, 300, 301, 303, 305, 307, 527, 586, 592, 595, 597, 607, 669, 704, 756, 757, 761

(56) References Cited

U.S. PATENT DOCUMENTS

| | | | |
|---|---|---|---|
| 5,296,727 A | | 3/1994 | Kawai et al. ................ 257/260 |
| 5,434,093 A | | 7/1995 | Chau et al. .................... 437/41 |
| 5,496,750 A | | 3/1996 | Moslehi ........................ 437/41 |
| 5,581,114 A | * | 12/1996 | Bashir et al. ................ 257/588 |
| 5,949,105 A | | 9/1999 | Moslehi ....................... 257/336 |
| 5,994,747 A | * | 11/1999 | Wu ............................. 257/408 |
| 6,165,857 A | * | 12/2000 | Yeh et al. .................... 438/303 |
| 6,197,645 B1 | | 3/2001 | Michael et al. ............. 438/300 |
| 6,214,673 B1 | * | 4/2001 | Grebs et al. ................ 438/274 |
| 6,281,085 B1 | * | 8/2001 | Yeo ............................. 438/303 |
| 6,287,926 B1 | | 9/2001 | Hu et al. ..................... 438/306 |
| 6,489,206 B2 | * | 12/2002 | Chen et al. .................. 438/300 |
| 6,562,686 B2 | * | 5/2003 | Lee ............................. 438/301 |
| 6,777,298 B2 | * | 8/2004 | Roy et al. .................... 438/301 |
| 6,787,425 B1 | * | 9/2004 | Rotondaro et al. ......... 438/300 |
| 6,815,770 B1 | * | 11/2004 | Chien et al. ................ 257/344 |

OTHER PUBLICATIONS

IBM Technical Disclosure Bulletin, Dec. 1988, vol. 31, issue 7, pp. 129–131.*
K. De Meyer et al., "Raised Source/Drains with Disposable Spacers for Sub 100 nm CMOS technologies", Extended Abstracts of Int'l Workshop on Junction Technology 2001, pp. 5–3–1 to 5–3–4.

* cited by examiner

*Primary Examiner*—Richard Elms
*Assistant Examiner*—Michael K. Luhrs
(74) *Attorney, Agent, or Firm*—Thomas, Kayden, Horstemeyer & Risley

(57) ABSTRACT

A method of fabricating a MOSFET device featuring a raised source/drain structure on a heavily doped source/drain region as well as on a portion of a lightly doped source/drain (LDD), region, after removal of an insulator spacer component, has been developed. After formation of an LDD region a composite insulator spacer, comprised of an underlying silicon oxide spacer component and an overlying silicon nitride spacer component, is formed on the sides of a gate structure. Formation of a heavily doped source/drain is followed by removal of the silicon nitride spacer resulting in recessing of, and damage formation to, the heavily doped source/drain region, as well as recessing of the gate structure. Removal of a horizontal component of the silicon oxide spacer component results in additional recessing of the heavily doped source/drain region, and of the gate structure. A selective epitaxial growth procedure is then used to form a raised, single crystalline silicon structure on the recessed and damaged heavily doped source/drain and LDD regions, while a polycrystalline silicon structure is grown on the underlying recessed gate structure. Metal silicide is then formed on the raised, single crystalline silicon structure and on the polycrystalline silicon structure.

19 Claims, 4 Drawing Sheets

METHOD OF FABRICATING A HIGH PERFORMANCE MOSFET DEVICE FEATURING FORMATION OF AN ELEVATED SOURCE/DRAIN REGION

BACKGROUND OF THE INVENTION

(1) Field of the Invention

The present invention relates to methods used to fabricate semiconductor devices, and more specifically to a method used to fabricate a high performance metal oxide semiconductor field effect transistor (MOSFET), device, via the implementation of a disposable insulator spacer component and of a raised source/drain region.

(2) Description of Prior Art

Advances in specific semiconductor fabrication disciplines such as photolithography and dry etching, have allowed the attainment of sub-micron MOSFET devices to be routinely achieved. In addition to the breakthroughs in the above fabrication disciplines, process and structural innovations have also contributed to the attainment of MOSFET devices comprised with sub-50 nm channel lengths. To successfully form sub-50 nm MOSFET devices specific regions, such as source/drain regions have to be shallow. However it is difficult to maintain shallow source/drain regions during subsequent silicide procedures used to reduce source/drain resistance. The thicker the silicide formation the greater the consumption of source/drain region, therefore presenting process difficulties when attempting to form silicide on the shallow source/drain regions needed for sub-50 nm MOSFET devices. One method used to overcome the vulnerability of shallow source/drain regions in a semiconductor substrate, during silicide formation, is the raised or elevated source/drain structure, formed via selective growth of single crystalline silicon on the shallow source/drain region. The selectively grown raised source/drain structure, comprised with the same dopant conductivity type as the underlying shallow source/drain region in the semiconductor substrate, can easily except overlying silicide formation without consumption of the underlying shallow source/drain region located in a top portion of the semiconductor substrate. The procedures used to form raised source/drain structure incorporates removal of an insulator spacer located on the sides of a gate structure to expose additional portions of a heavily doped source/drain region, and therefore when overlaid with the raised source/drain structures provide still additional decreases in source/drain resistance. The removal of the insulator spacer component can however damage the exposed shallow source/drain region. In addition some raised source/drain fabrication procedures do not allow silicide formation to occur on the gate structure, therefore limiting gate resistance reduction.

The present invention will describe a novel process sequence in which a raised source/drain structure is formed via low temperature selective epitaxial growth procedures after formation of the shallow source/drain region in the semiconductor substrate, and after removal of an overlying or outer insulator spacer component, therefore regrowing non-damaged silicon on the possibly damaged surface of the shallow source/drain region. In addition a novel process sequence for etching back a horizontal segment of an underlying, or inner insulator spacer component, allowing a portion of a lightly doped source/drain (LDD), region to be exposed and overlaid by the subsequently grown raised source/drain structure, is also presented in this invention. Prior art such as Moslehi, in U.S. Pat. No. 5,949,105, Moslehi, in U.S. Pat. No. 5,496,750, Michael et al, in U.S. Pat. No. 6,197,645 B1, Hu et al, in U.S. Pat. No. 6,287,926 B1, Kawai et at, in U.S. Pat. No. 5,296,727, and Chau et al, in U.S. Pat. No. 5,434,093 B1, describe methods of forming raised source/drain structures and methods to remove disposable spacers. However none of these prior art describe the novel process sequence provided in this present invention in which an elevated source/drain structure is formed on a shallow source/drain region and on a portion of a lightly doped source/drain region.

SUMMARY OF THE INVENTION

It is an object of this invention to fabricate a MOSFET device featuring a raised source/drain structure.

It is another object of this invention to form a heavily doped source/drain region in a area of a semiconductor substrate not covered by a gate structure or by a composite insulator spacer located on the sides of the gate structure, followed by the removal of the outer, or overlying insulator spacer component of the composite insulator spacer, exposing an inner, or underlying insulator spacer component of the composite spacer comprised with a horizontal segment located overlying a portion of the lightly doped source/drain region.

It is still another object of this invention to remove the horizontal segment of the underlying insulator component of the composite insulator spacer, exposing a portion of a lightly doped source/drain region.

It is still yet another object of this invention to perform a selective epitaxial growth procedure to form a raised, single crystalline silicon source/drain structure on the heavily doped source/drain region and on the portion of exposed lightly doped source/drain region, and to grow polycrystalline silicon on the exposed surface of a conductive gate structure, all recessed during previous processes used to remove portions of the composite insulator spacers.

In accordance with the present invention a method of forming a raised source/drain structure on a heavily doped source/drain region and on a portion of lightly doped source/drain region, located in portion of a semiconductor substrate previously damaged during procedures used to remove components of a composite insulator spacer, is described. After definition of a conductive gate structure on a underlying gate insulator layer a lightly doped source/drain (LDD), or a source/drain extension region, is formed in a portion of the semiconductor substrate not covered by the conductive gate structure. After definition of a composite insulator spacer on the sides of the conductive gate structure, comprised of an underlying silicon oxide spacer component and an overlying silicon nitride spacer component, a heavily doped source/drain region is formed in the area of the semiconductor substrate not covered by the conductive gate structure or by the composite insulator spacer. A wet etch procedure is used to remove the silicon nitride component of the composite insulator spacer exposing the silicon oxide spacer component now comprised with a horizontal segment overlying a portion of the LDD region, with the wet etch procedure damaging as well as removing a top portion of surface of the exposed heavily doped source/drain region, and removing a top portion of the exposed conductive gate structure. A silicon oxide thinning procedure is used to remove the horizontal segment of the silicon oxide spacer component exposing of a portion of the LDD region, with the silicon oxide thinning procedure resulting in additional damage to, and removal of, the heavily doped source/drain region, as well as resulting in additional recessing of the conductive gate structure. A selective epitaxial growth (SEG), procedure is performed resulting in a raised source/drain structure, comprised of single crystalline silicon, located on the damaged heavily doped source/drain region and on the exposed portion of LDD region, with the SEG procedure also resulting in the regrowth of polycrystalline material in the recessed portion of the conductive gate structure. Implantation and anneal procedures are then employed to adequately dope the raised source/drain structures, as well as the regrown polycrystalline structure located on the recessed conductive gate structure.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

Figure 1:
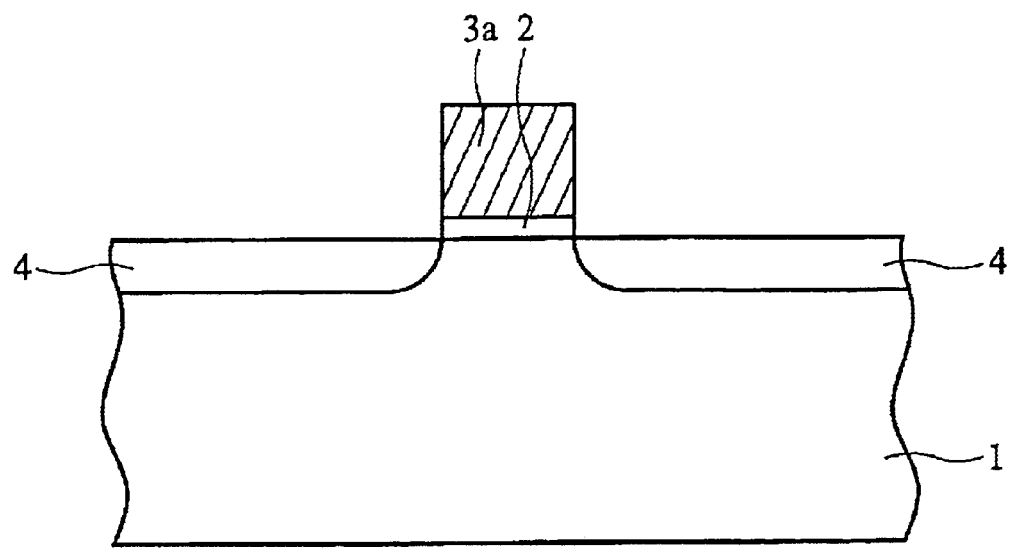
FIGS. 1–7, which schematically in cross-sectional style illustrate key stages used to fabricate a MOSFET device featuring a raised source/drain structure located on a heavily doped source/drain region and on a portion of lightly doped source/drain region, both located in portion of a semiconductor substrate previously damaged during procedures used to remove components of a composite insulator spacer.

The method of fabricating a MOSFET device featuring a raised source/drain structure on a heavily doped source/drain region, and on a portion of lightly doped source/drain region, located in portion of a semiconductor substrate previously damaged during procedures used to remove components of a composite insulator spacer, will now be described in detail. Semiconductor substrate 1, comprised of single crystalline P type silicon, featuring a <100> crystallographic orientation, is used and schematically shown in FIG. 1. Gate insulator layer 2, comprised of silicon dioxide, is thermally grown to a thickness between about 10 to 100 Angstroms, in an oxygen-steam ambient. A conductive material, such as polysilicon, is next deposited via low pressure chemical vapor deposition (LPCVD), procedures, to a thickness between about 500 to 3000 Angstroms. The polysilicon layer can be doped in situ during deposition via the addition of arsine, or phosphine to a silane or disilane ambient, or the polysilicon layer can be intrinsically deposited then subjected to implantation of arsenic or phosphorous ions. A photoresist shape, not shown in the drawings, is next formed and used as an etch mask to allow an anisotropic reactive ion etch (RIE), procedure to define conductive gate structure 3a, comprised with a width between about 200 to 2500 Angstroms. The narrow width of conductive gate structure 3a, will allow a sub-50 nm MOSFET device, or a MOSFET device with a channel length less than 50 nm, to be ultimately be realized. The anisotropic RIE procedure is performed using $Cl_2$ or $SF_6$ as a selective etchant for polysilicon, terminating at the appearance of the top surface of gate insulator layer 2. Removal of the photoresist shape used for definition of conductive gate structure 3a, is accomplished via plasma oxygen ashing and wet clean procedures, with a buffered hydrofluoric acid cycle, used as a component of the wet clean procedures, removing the portions of gate insulator layer 2, not covered by conductive gate structure 3a. Lightly doped source/drain (LDD), region 4, is next formed in a portion of semiconductor substrate 1, not covered by conductive gate structure 3a, via implantation of arsenic or phosphorous ions, at an energy between about 2 to 10 KeV, and at a dose between about 1E14 to 5E15 atoms/$cm^2$. This is schematically shown in FIG. 1.

Figure 2:
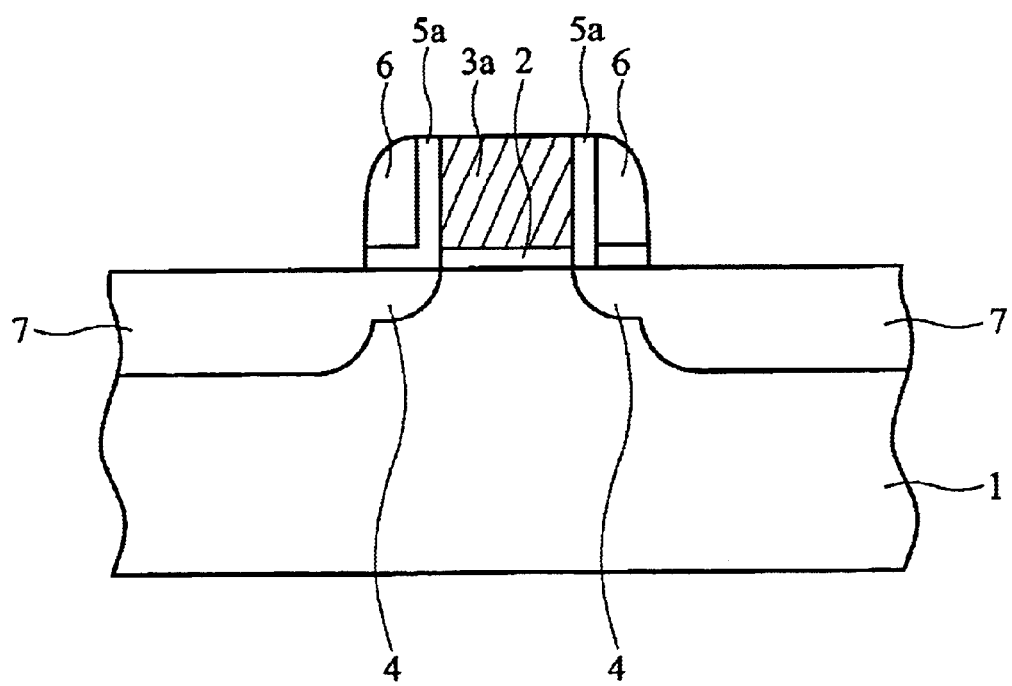

A silicon oxide layer is next deposited to a thickness between about 200 to 1000 Angstroms, via LPCVD or via plasma enhanced chemical vapor deposition (PECVD), procedures, followed by deposition of an overlying silicon nitride layer at a thickness between about 200 to 1000 Angstroms, again via LPCVD or PECVD procedures. An anisotropic RIE procedure is next employed to define a composite insulator spacer on the sides of conductive gate structure 3a. The anisotropic RIE procedure initiates with definition of overlying silicon nitride spacer component 6, using $Cl_2$ or $CF_4$ as a selective etchant for silicon nitride, with the anisotropic RIE procedure concluding with the definition of underlying silicon oxide spacer component 5a, obtained using $CHF_3$ as a selective etchant for silicon oxide, with this cycle of the anisotropic RIE procedure terminating at the appearance of the top surface of LDD region 4, and of the appearance of the top surface of conductive gate structure 3a. This is schematically shown in FIG. 2. Heavily doped source/drain region 7, also schematically shown in FIG. 2, is next formed via implantation of arsenic or phosphorous ions, at an energy between about 10 to 50 KeV, and at a dose between about 1E14 to 5E15 atoms/$cm^2$, in portions of semiconductor substrate 1, not covered by conductive gate structure 3a, or by the composite insulator spacers located on the sides of conductive gate structure 3a.

Figure 3:
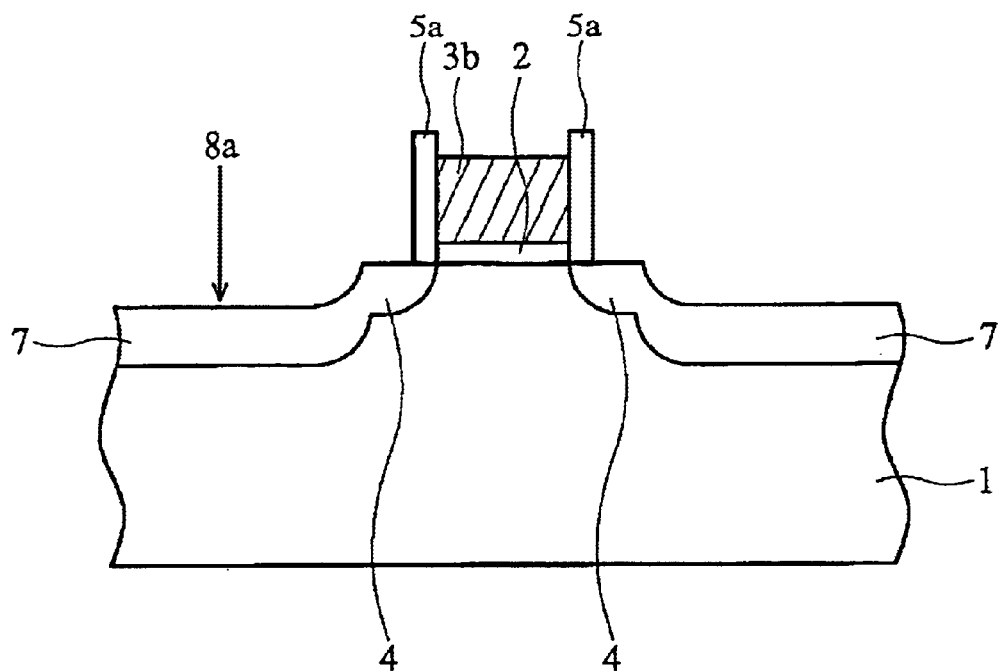
Figure 4:
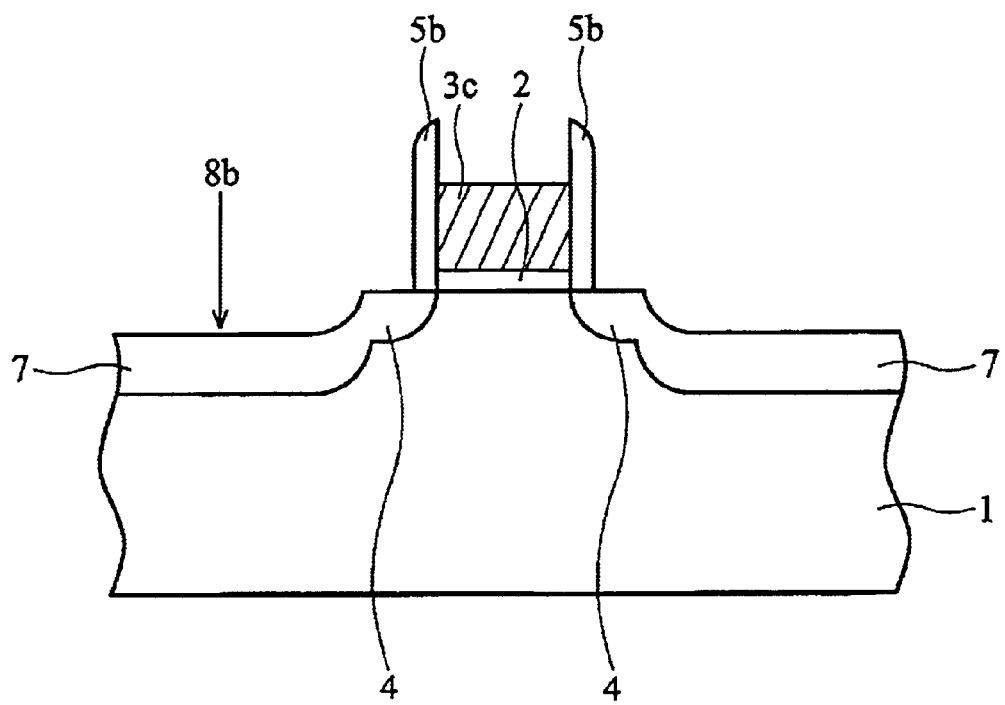

The procedures employed to increase the level of surface area of heavily doped source/drain region 7, and to expose a portion of LDD region 4, for an overlying raised source/drain structure, via removal of regions of the composite insulator spacer, are next addressed and schematically shown using FIGS. 3–4. A hot phosphoric acid solution, at a temperature between about 150 to 250° C., is used to remove silicon nitride spacer component 6, exposing underlying silicon oxide spacer component 5a. This is schematically shown in FIG. 3. Silicon oxide spacer component 5a, is comprised of a vertical feature located on the sides of the conductive gate structure, as well as a horizontal feature which overlays a portion of LDD region 4. The hot phosphoric acid procedure in addition to removing silicon nitride spacer component 6, also removed a top portion, between about 10 to 100 Angstroms, of the conductive gate structure, resulting in recessed conductive gate structure 3b. In addition the hot phosphoric acid solution resulted in the removal of a top portion, between about 10 to 100 Angstroms, of heavily doped source/drain 7, leaving heavily doped source/drain region 7, with a damaged top surface 8a.

To expose a portion of LDD region 4, to a subsequent overlying raised source/drain structure, a RIE procedure is used to remove the horizontal segment of silicon oxide spacer component 5a. This is accomplished using $CF_4$ as a etchant for silicon oxide resulting in silicon oxide spacer component 5b, now comprised of only a vertical feature located on the sides of the conductive gate structure. The RIE procedure in addition to removing the horizontal segment of the silicon oxide spacer component also removes a portion of exposed heavily doped source/drain region 7, between about 10 to 100 Angstroms, resulting in a heavily doped source/drain region shallower than desired for attainment of a minimum source/drain resistance. In addition the RIE procedure continued the damage procedure of the remaining heavily doped source/drain region 7, resulting in damaged surface 8b. The RIE procedure used for removal of the horizontal segment of the silicon oxide spacer component also continued the recessing of the conductive gate structure, removing between about 10 to 100 Angstroms of material from recessed conductive gate structure 3b, resulting in fully recessed conductive gate structure 3c. This is schematically shown in FIG. 4.

Figure 5:
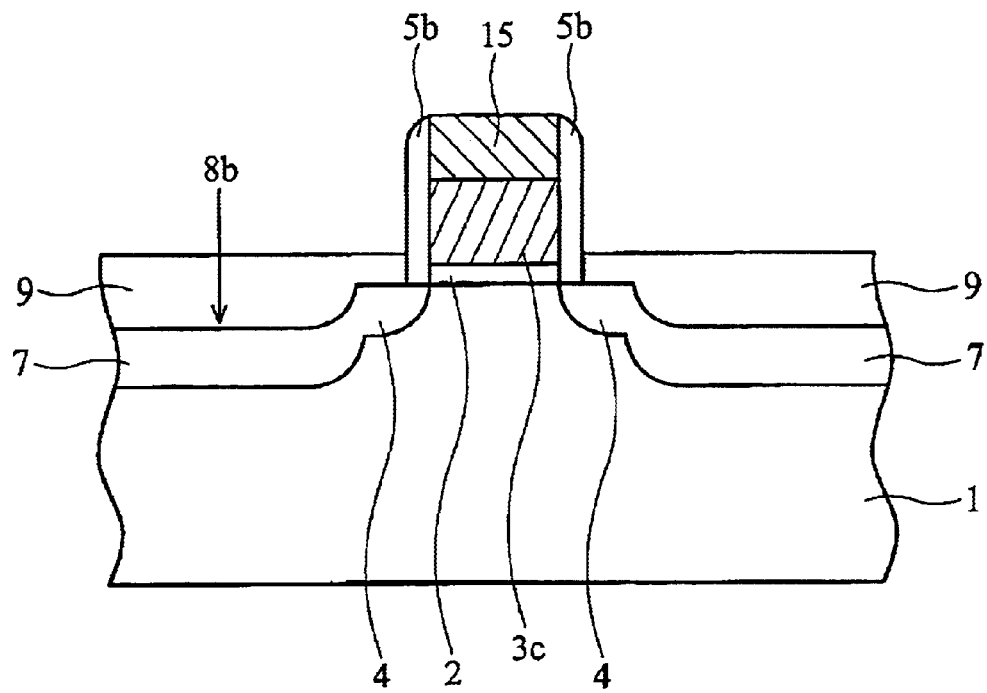

The method of selectively growing a raised source/drain structure on the underlying damaged surface of heavily doped source/drain region 7, and on exposed portion of LDD region 4, employed to reduce source/drain resistance and to bury the damaged surface, is next addressed and schematically shown using FIG. 5. An SEG procedure is performed at a temperature between about 500 to 900° C., at a pressure between about 0.10 to 100 mtorr, for a time between about 1 to 60 min, using silane or disilane as a source of silicon. The result of the SEG procedure is the selective growth of single crystalline silicon, raised source/drain structure 9, at a thickness between about 100 to 800 Angstroms, on the exposed surface of heavily doped source/drain region 7, and on the exposed portion of LDD region 4. The SEG procedure also results in the growth of raised conductive structure 15, at a thickness between about 100 to 800 Angstroms, on the surface of recessed conductive gate 3c. If recessed conductive gate structure 3c, is comprised of material other than a single crystalline silicon, raised conductive gate shape 15, will be comprised of polycrystalline silicon. No single crystalline or polycrystalline growth occurs on insulator surfaces, such as the surface of silicon oxide spacer component 5b.

Figure 6:
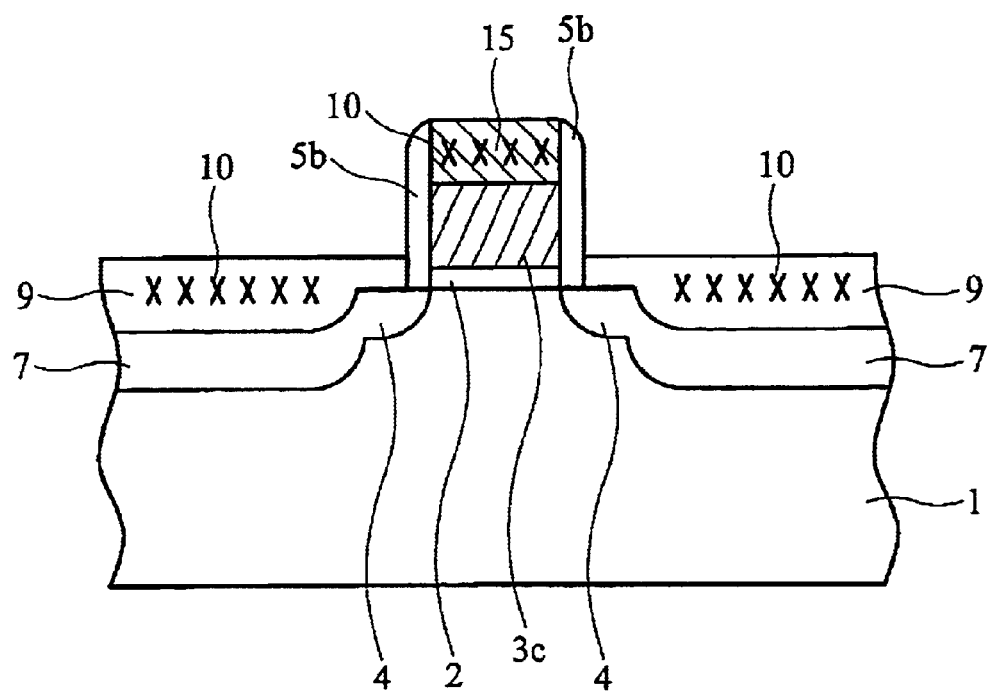

To insure lower source/drain, as well as gate resistance, an ion implantation procedure is employed to lower the resistance of raised source/drain structure 9, and of raised conductive structure 15. The implantation procedure is performed using arsenic or phosphorous ions, at an energy between about 5 to 50 KeV, at a dose between about 5E14 to 1E16 atoms/cm$^2$, placing N+ ions 10, in both raised source/drain structure 9, and in raised conductive structure 15. An anneal procedure is next performed using either conventional furnace procedures, or via rapid thermal anneal (RTA), procedures, to activate N+ ions 10. The result of these procedures is schematically shown in FIG. 6.

Figure 7:
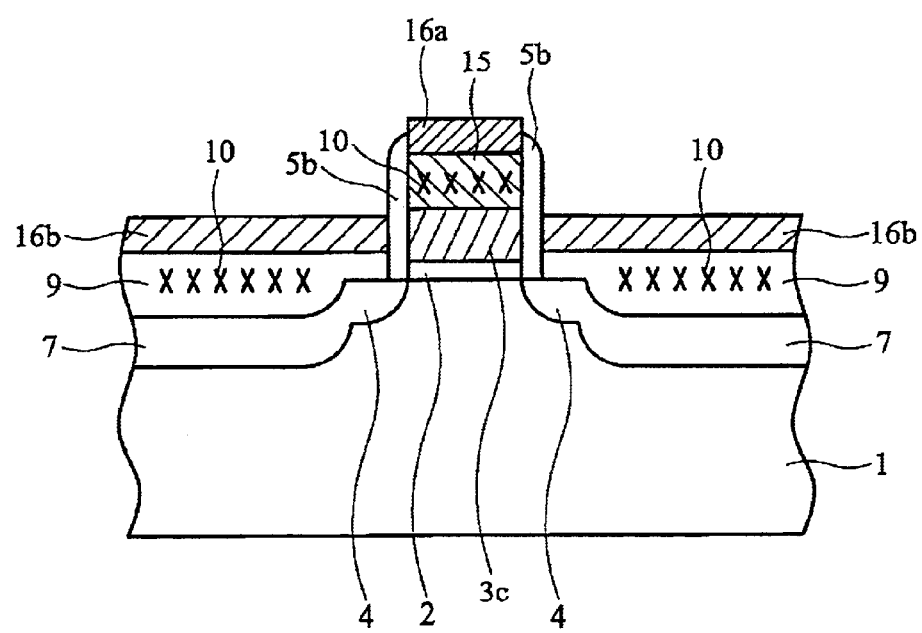

To further lower resistance metal silicide 16, is selectively formed on raised source/drain structure 9, and on raised conductive gate structure 15. This is accomplished via plasma vapor deposition of a metal layer such as titanium, cobalt, nickel, zirconium, tungsten, or tantalum, at a thickness between about 100 to 500 Angstroms. An anneal procedure is next performed, using either conventional furnace procedures, or rapid thermal anneal (RTA), procedures, to selectively form metal silicide 16, on raised source/drain structure 9, and on raised conductive gate structure 15. The metal layer located on silicon oxide spacer component 3b, remains unreacted. The thickness of metal silicide 16, comprised of either titanium silicide, cobalt silicide, nickel silicide, zirconium silicide, tungsten silicide, or tantalum silicide, is between about 100 to 300 Angstroms. Unreacted metal is selectively removed from the surface of silicon oxide spacer component 3b, via wet etch procedures. If desired an additional anneal procedure can be employed to further reduce the resistance of metal silicide 16. The result of the silicide procedure is schematically shown in FIG. 7. It should be noted that if the raised structures were not formed the shallow depth of heavily doped source/drain region 7, as well as the reduced thickness of recessed conductive gate structure 5c, would have presented difficulties when attempting to lower resistance via a silicide procedure. The consumption of silicon during the silicide procedure could have resulted in the undesired result of metal silicide forming too close to gate insulator layer 2, in addition to total consumption of the shallow source/drain region in semiconductor substrate 1. The raised conductive shapes prevented these possibilities from occurring anneal procedure.

Although this invention is described for a N channel MOSFET device, it should be understood that a P channel MOSFET device can also be fabricated using this invention which features a raised source/drain structure.

While this invention has been particularly shown and described with reference to the preferred embodiments thereof, it will be understood by those skilled in the art that various changes in form and details may be made without departing from the spirit and scope of this invention.

What is claimed is:

1. A method of forming a metal oxide semiconductor field effect transistor (MOSFET), on a semiconductor substrate, comprising the steps of:

providing a conductive gate structure, having a top surface, on an underlying gate insulator layer with a lightly doped source/drain (LDD) region located in an area of said semiconductor substrate not covered by said conductive gate structure;

forming a composite insulator spacer, having inner portions and outer portions, on the sides of said conductive gate structure, with said inner portions directly contacting said conductive structure and said LDD region, and forming a heavily doped source/drain region in an area of said semiconductor substrate not covered by said conductive gate structure or by said composite insulator spacers; performing a first procedure to remove said outer portions of said composite insulator spacer to expose said inner portions of said composite insulator spacer;

performing a second procedure to etch back said conductive gate structure until top surface of said conductive gate structure is lower than top surface of said inner portions of said composite insulator spacer component, and to remove a portion of said formed heavily doped source/drain region;

performing a third procedure to grow raised first conductive shapes on said heavily doped source/drain region and on exposed portion of said LDD region, and to form a raised second conductive shape on recessed, said conductive gate structure;

implanting dopant into said raised conductive shapes, and into said raised second conductive shape; and selectively forming metal silicide on said raised first conductive shapes and on said raised second conductive shape.

2. The method of claim 1, wherein said conductive gate structure is a doped, polysilicon gate structure, defined at a thickness between about 500 and 3000 Angstroms.

3. The method of claim 1, wherein said inner portions of said composite insulator spacer is comprised of silicon oxide, defined at a thickness between about 200 and 1000 Angstroms.

4. The method of claim 1, wherein said outer portions of said composite insulator spacer is comprised of silicon nitride, defined at a thickness between about 200 and 1000 Angstroms.

5. The method of claim 1, wherein said first procedure used to remove said outer portions of said composite insulator spacer is performed using a hot phosphoric acid solution, at a temperature between about 150 to 250°C.

6. The method of claim 1, wherein said second procedure is used to remove a horizontal segment of said inner portions of said composite insulator spacer and is performed via a reactive ion etch procedure using $CF_4$ as an etchant.

7. The method of claim 1, wherein said third procedure, used to grow raised first conductive shapes on said heavily doped source/drain region, and to grow said raised second conductive shape on said conductive gate structure, is a selective epitaxial growth procedure performed at a temperature between about 500 and 900°C., at a pressure between about 0.10 and 100 mtorr, using silane or disilane as reactants.

8. The method of claim 1, wherein said first raised conductive shapes are comprised of single crystalline silicon, at a thickness between about 100 and 800 Angstroms.

9. The method of claim 1, wherein said second raised conductive shape is comprised of polycrystalline silicon, at a thickness between about 100 and 800 Angstroms.

10. A method of forming a metal oxide semiconductor field effect transistor (MOSFET), on a semiconductor substrate, featuring raised single crystalline silicon source/drain shapes, and featuring a raised polysilicon gate shape, comprising the steps of:

providing a polysilicon gate structure on an underlying silicon dioxide gate insulator layer, with a lightly doped source/drain (LDD), region located in an area of said semiconductor substrate not covered by said polysilicon gate structure;

forming a composite insulator spacer on the sides of said polysilicon gate structure, with said composite insulator spacer comprised of an underlying silicon oxide spacer component, and comprised of an overlying silicon nitride spacer component;

forming a heavily doped source/drain region in an area of said semiconductor substrate not covered by said polysilicon gate structure or by said composite insulate spacer;

performing a wet etch procedure to remove said overlying silicon nitride spacer component, resulting in an underlying silicon oxide spacer component comprised with vertical feature located on the sides of said conductive gate structure with a horizontal segment located on a portion of said LDD region, with said wet etch procedure recessing said polysilicon gate structure and recessing said heavily doped source/drain region;

performing a dry etch procedure to remove horizontal segment of said underlying silicon oxide spacer component, exposing a portion of said LDD region, and further recessing said heavily doped source/drain region and further recessing said polysilicon gate structure;

performing a selectively epitaxial growth procedure to grow said raised single crystalline silicon source/drain shapes on recessed, said heavily doped source/drain region and on exposed portion of said LDD region, and to grow said raised polysilicon gate shape on recessed, said polysilicon gate structure;

performing an ion implantation procedure to place dopants into said raised single crystalline silicon source/drain shapes, and into said raised polysilicon gate shape; and selectively forming metal silicide on said raised single crystalline silicon source/drain shapes and on said raised polysilicon gate shape.

11. The method of claim 10, wherein the thickness of said underlying silicon oxide spacer component is between about 200 to 1000 Angstroms.

12. The method of claim 10, wherein the thickness of said underlying silicon oxide spacer component is between about 200 to 1000 Angstroms.

13. The method of claim 10, wherein the thickness of said overlying silicon nitride spacer component is between about 200 to 1000 Angstroms.

14. The method of claim 10, wherein said wet etch procedure used to remove said overlying silicon nitride spacer component, is performed using a hot phosphoric acid solution, at a temperature between about 150 and 250°C.

15. The method of claim 10, wherein said dry etch procedure used to remove said horizontal segment of said underlying silicon oxide spacer component, is a reactive ion etch procedure, performed using $CF_4$ as an etchant.

16. The method of claim 10, wherein said selective epitaxial growth procedure is performed at a temperature between about 500 and 900°C., at a pressure between about about 0.10 to 100 mtorr, using silane or disilane as reactants.

17. The method of claim 10, wherein the thickness of said raised single crystalline source/drains shapes is between about 100 to 800 Angstroms.

18. The method of claim 10, wherein the thickness of said raised polysilicon gate shape is between about 100 to 800 Angstroms.

19. The method of claim 10, wherein said metal silicide formed on said raised single crystalline source/drain shapes and on said raised polysilicon gate shape, is chosen from a group containing titanium silicide, cobalt silicide, nickel silicide, zirconium silicide, tungsten silicide, and tantalum silicide.

* * * * *